United States Patent
Meng

(10) Patent No.: US 10,185,181 B2
(45) Date of Patent: Jan. 22, 2019

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Lingjuan Meng, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/122,903

(22) PCT Filed: Sep. 2, 2015

(86) PCT No.: PCT/CN2015/088824
§ 371 (c)(1),
(2) Date: Aug. 31, 2016

(87) PCT Pub. No.: WO2016/165265
PCT Pub. Date: Oct. 20, 2016

(65) Prior Publication Data
US 2017/0075170 A1    Mar. 16, 2017

(30) Foreign Application Priority Data

Apr. 14, 2015 (CN) .......................... 2015 1 0176720

(51) Int. Cl.
G02F 1/1337 (2006.01)
G02F 1/1333 (2006.01)
(Continued)

(52) U.S. Cl.
CPC .. *G02F 1/133707* (2013.01); *G02F 1/133345* (2013.01); *G02F 1/134309* (2013.01);
(Continued)

(58) Field of Classification Search
CPC combination set(s) only.
See application file for complete search history.

(56) References Cited

U.S. PATENT DOCUMENTS

2005/0264720 A1    12/2005  Itou et al.
2008/0055526 A1*    3/2008  Ino .................... G02F 1/133555
                                                349/114
2012/0169981 A1*    7/2012  Murata ............. G02F 1/134363
                                                349/138

FOREIGN PATENT DOCUMENTS

CN    101140399 A    3/2008
CN    101330087 A    12/2008
(Continued)

OTHER PUBLICATIONS

International Search Report and Written Opinion in PCT/CN2015/088824 dated Jan. 27, 2016, with English translation. 10 pages.
(Continued)

*Primary Examiner* — Quoc Hoang
(74) *Attorney, Agent, or Firm* — Womble Bond Dickinson (US) LLP

(57) ABSTRACT

Embodiments of the invention provide an array substrate. The array substrate comprises a plurality of pixel units. The array substrate comprises a first electrode layer, an insulating layer covering the first electrode layer, and a second electrode layer formed on the insulating layer. The first electrode layer comprises a first electrode arranged in each of the pixel units, the insulating layer comprises an insulating layer unit covering the surface of each of the first electrodes, and the second electrode layer comprises a second electrode arranged on the insulating layer unit. Within each of the pixel units, the insulating layer unit comprises a plurality of insulating regions, and at least one
(Continued)

A-A of the insulating regions has a dielectric constant different from dielectric constants of other insulating regions.

14 Claims, 3 Drawing Sheets

(51) Int. Cl.
    *G02F 1/1343*     (2006.01)
    *G02F 1/1362*     (2006.01)
    *H01L 27/12*     (2006.01)

(52) U.S. Cl.
    CPC ...... *G02F 1/136227* (2013.01); *H01L 27/124* (2013.01); *H01L 27/1248* (2013.01); *H01L 27/1259* (2013.01); *G02F 2001/134318* (2013.01); *G02F 2201/121* (2013.01); *G02F 2202/42* (2013.01)

(56) References Cited

FOREIGN PATENT DOCUMENTS

| | | |
|---|---|---|
| CN | 102549489 A | 7/2012 |
| CN | 102866543 A | 1/2013 |
| CN | 102998860 A | 3/2013 |
| CN | 103336396 A | 10/2013 |
| CN | 104730784 A | 6/2015 |
| JP | 2000305100 A | 11/2000 |
| KR | 20120076970 A | 7/2012 |

OTHER PUBLICATIONS

Office Action in Chinese Application No. 201510176720.8 dated Mar. 1, 2017, with English translation. 12 pages.
Office Action in Chinese Application No. 201510176720.8 dated Aug. 1, 2017, with English translation.

* cited by examiner

# ARRAY SUBSTRATE AND MANUFACTURING METHOD THEREOF, DISPLAY PANEL AND DISPLAY DEVICE

RELATED APPLICATIONS

The present application is the U.S. national phase entry of PCT/CN2015/088824, with an international filling date of Sep. 2, 2015, which claims the benefit of Chinese Patent Application NO. 201510176720.8, filed on Apr. 14, 2015, the entire disclosure of which is incorporated herein by reference.

FIELD OF THE INVENTION

The present disclosure relates to the field of display device, and specifically to an array substrate, a display panel comprising the array substrate, a display device comprising the display panel and a method for manufacturing the array substrate.

BACKGROUND

To enable a liquid crystal display device to have a wide viewing angle, the liquid crystal display device may usually be designed as a dual-domain liquid crystal display, that is, the liquid crystal molecules within one pixel unit are deflected towards two different directions when the display device performs displaying.

Currently, the dual-domain display is typically achieved by changing the directions of electrode strips for the pixel electrode in the pixel unit, but such process is rather complicated.

Therefore, how to achieve a display device that is capable of performing dual-domain display with simple process becomes a technical problem to be solved in the art.

SUMMARY

It is an object of the invention to provide an array substrate, a display panel comprising the array substrate, a display device comprising the display panel and a method for manufacturing the array substrate. The display device is enabled to achieve multi-domain display by simply changing the structure of the insulating layer in the array substrate.

As one aspect of the invention, there is provided an array substrate. The array substrate may comprise a plurality of pixel units, the array substrate comprises a first electrode layer, an insulating layer covering the first electrode layer and a second electrode layer formed on the insulating layer, the first electrode layer comprising a first electrode arranged in each of the pixel units, the insulating layer comprising an insulating layer unit covering a surface of each of the first electrodes, the second electrode layer comprising a second electrode arranged on the insulating layer unit. Within each of the pixel units, the insulating layer unit comprises a plurality of insulating regions, at least one of the insulating regions having a dielectric constant different from dielectric constants of other insulating regions.

In an embodiment, within each of the pixel units, the insulating layer unit comprises a first insulating region, a second insulating region and a third insulating region, the first insulating region and the third insulating region have the same dielectric constant, the second insulating region has a dielectric constant different from that of the first insulating region, the second insulating region is located between the first insulating region and the third insulating region.

In another embodiment, an area of the second insulating region is half an area of the pixel unit, an area of the first insulating region is equal to that of the third insulating region.

In another embodiment, within each of the pixel units, the first insulating region comprises a first bottom insulating layer and a first top insulating layer, the third insulating region comprises a third bottom insulating layer and a third top insulating layer, the first bottom insulating layer, the second insulating region and the third bottom insulating layer are formed as one-piece, an dielectric constant of the first top insulating layer is the same as that of the third top insulating layer. A top surface of the first top insulating layer, a top surface of the third top insulating layer and a top surface of the second insulating region are flush with one another.

In an embodiment, the first bottom insulating layer, the second insulating region and the third bottom insulating layer are made of a nitride of silicon, and the first top insulating layer and the third top insulating layer are made of a transparent resin.

In an embodiment, the material of the first insulating region is the same as that of the third insulating region, and the material of the first insulating region is different from that of the second insulating region. In an embodiment, the first insulating region is made of an oxide of silicon, and the second insulating region is made of a nitride of silicon.

In an embodiment, in each of the pixel units, the second electrode comprises a second left electrode and a second right electrode. The second left electrode comprises a plurality of mutually parallel second left electrode strips, the second right electrode comprises a plurality of mutually parallel second right electrode strips, and the second left electrode strips and the second right electrode strips have different inclined directions.

In an embodiment, the array substrate further comprises a gate insulating layer arranged between the first electrode layer and the insulating layer.

In an embodiment, the second left electrode and the second right electrode are mirror symmetrical with respect to a central line of the pixel unit. The central line may divide the pixel unit into two portions along a length direction, and the angle between the second left electrode strip and the central line is 7° to 11°.

In an embodiment, the first electrode is a block electrode.

As another aspect of the invention, there is provided a display panel that may comprise the array substrate as provided by any of the respective embodiments of the invention.

As a further aspect of the invention, there is provided a display device comprising a display panel as provided by the embodiment of the invention.

As yet another aspect of the invention, there is provided a method for manufacturing an array substrate, the array substrate comprising a plurality of pixel units, the manufacturing method comprises:

forming a first electrode layer, the first electrode layer comprising a first electrode arranged in each of the pixel units;

forming an insulating layer, the insulating layer covering the first electrode layer, and the insulating layer comprising an insulating layer unit covering a surface of each of the first electrodes, within each of the pixel units, the insulating layer unit comprising a plurality of insulating regions, at least one of the insulating regions having a dielectric constant different from dielectric constants of other insulating regions;

forming a second electrode layer, the second electrode layer comprising a second electrode arranged on the insulating layer unit.

In an embodiment, within each of the pixel units, the insulating layer unit comprises a first insulating region, a second insulating region and a third insulating region, the first insulating region and the third insulating region have the same dielectric constant, the second insulating region has a dielectric constant different from the dielectric constant of the first insulating region, the second insulating region is located between the first insulating region and the third insulating region.

In an embodiment, the area of the second insulating region is half the area of the pixel unit, and the area of the first insulating region is equal to that of the third insulating region.

In an embodiment, the step of forming an insulating layer comprises:

forming a bottom insulating material layer, within each of the pixel units, the bottom insulating material layer comprising a first bottom insulating layer, the second insulating region and a third bottom insulating layer;

forming a top insulating material layer, the top insulating material layer comprising a top insulating material unit arranged within each of the pixel units, the top insulating material unit comprising a first top insulating material layer arranged on the first bottom insulating layer and a third top insulating material layer arranged on the third bottom insulating layer, a dielectric constant of the first top insulating material layer being the same as that of the third top insulating material layer, a top surface of the first top insulating material layer, a top surface of the third top insulating material layer and a top surface of the second insulating region being flush with one another.

In an embodiment, the bottom insulating material layer is made of a nitride of silicon, and the top insulating material layer is made of a transparent resin.

Alternatively, the step of forming an insulating layer comprises:

forming a first insulating material layer;

forming a first through hole at a position on the first insulating material layer corresponding to the first insulating region, and forming a third through hole at a position on the first insulating material layer corresponding to the third insulating region, thereby forming a second insulating region using the first insulating material layer;

forming the first insulating region in the first through hole, and forming the third insulating region in the third through hole.

In an embodiment, the first insulating region is made of an oxide of silicon, and the second insulating region is made of a nitride of silicon.

In an embodiment, in each of the pixel units, the second electrode comprises a second left electrode and a second right electrode. The second left electrode comprises a plurality of mutually parallel second left electrode strips, the second right electrode comprises a plurality of mutually parallel second right electrode strips, and the second left electrode strips and the second right electrode strips have different inclined directions.

In an embodiment, the manufacturing method further comprises forming a gate insulating layer located between the first electrode layer and the insulating layer.

In an embodiment, the second left electrode and the second right electrode are mirror symmetrical with respect to a central line of the pixel unit. The central line may divide the pixel unit into two portions along a length direction, and the angle between the second left electrode strip and the central line is 7° to 11°.

In an embodiment, the first electrode is a block electrode.

Since in each pixel unit, the intensity of the electric field between the first electrode and the second electrode is related to the dielectric constant of the insulating layer unit between the first electrode and the second electrode, and there is at least an insulating region in the insulating layer unit which has a different dielectric constant from other insulating regions, there at least exist two different electric field intensities in one pixel unit, such that there are at least two different liquid crystal molecule deflection directions in one pixel unit. In this way, the array substrate provided by the embodiments of the invention may enable the liquid crystal display panel to achieve multi-domain display.

In the display device, there is a low requirement on the dimension precision for the insulating layer unit, and the insulating layer unit has a larger size than an electrode strip. Therefore, a multi-domain liquid crystal display device may be implemented by simply changing the structure of the insulating layer unit, thereby reducing the process cost for manufacturing the array substrate.

BRIEF DESCRIPTION OF THE DRAWINGS

The drawings are intended to provide further understanding of embodiments of the invention and constitute a part of the description, which are used for illustrating the invention together with specific embodiments below, rather than limiting the invention. In the drawings.

DETAILED DESCRIPTION OF THE INVENTION

Figure 1:
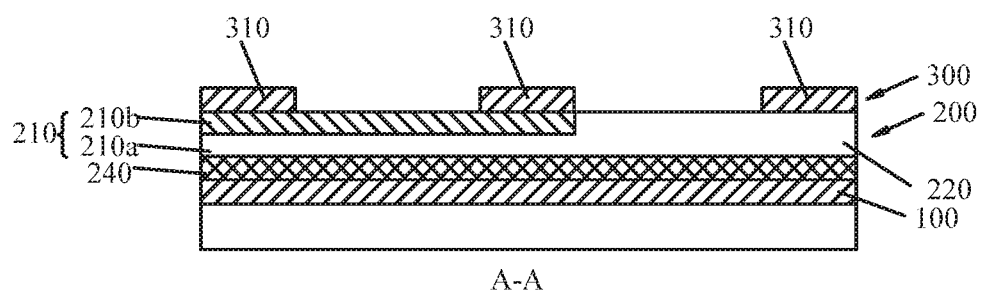
FIG. 1 is a sectional schematic view of an array substrate provided by an embodiment of the invention.

Specific embodiments of the invention will be set forth below in detail with reference to the drawings. It should be understood that the embodiments described here are only used for illustrating and explaining the invention, rather than limiting the invention.

In the following description of the embodiments in connection with the drawings, the reference signs below will be used:

| | |
|---|---|
| 100: first electrode | 200: insulating layer unit |
| 210: first insulating region | 210a: first bottom insulating layer |
| 210b: first top insulating layer | 220: second insulating region |
| 230: third insulating region | 240: gate insulating layer |

300: second electrode
310: second left electrode strip   320: second right electrode strip
410, 420, 430, 440: liquid crystal molecules As an embodiment of the invention, there is provided an array substrate. The array substrate may be divided into a plurality of pixel units. The array substrate comprises a first electrode layer, an insulating layer covering the first electrode layer, and a second electrode layer formed on the insulating layer. The first electrode layer comprises a first electrode 100 arranged in each of the pixel units, the insulating layer comprises an insulating layer unit 200 covering the surface of each first electrode 100, and the second electrode layer comprises a second electrode 300 arranged on the insulating layer unit 200. Within each of the pixel units, the insulating layer unit 200 comprises a plurality of insulating regions, and at least one of the insulating regions has a dielectric constant different from dielectric constants of other insulating regions.

In a liquid crystal display device, deflection of the liquid crystal molecules is driven by a torsional force generated by the electrical field between the first electrode and the second electrode.

It is well known that a medium would generate induction charges when applied with an electric field, which consequently weaken the electric field. The ratio of the electric field in the medium to the original applied electric field (in vacuum) is namely a relative dielectric constant. A dielectric constant is a product of the relative dielectric constant and the absolute dielectric constant in vacuum. If a material with a high dielectric constant is placed in the electric field, the intensity of the electric field within the dielectric medium would decrease significantly.

When a voltage is applied to the first electrode and the second electrode, an electric field would be generated between the first electrode and the second electrode. The insulating layer unit 200 is a medium located between the first electrode and the second electrode. Since at least one insulating region of the insulating layer unit 200 has a dielectric constant different from the dielectric constants of other insulating regions, the intensity of the electric field between the first electrode and the second electrode at the insulating region with a dielectric constant different from those of other insulating regions will be different from the intensities of the electric fields at other regions.

In other words, in one pixel unit, there may be at least two different electric field intensities such that there are at least two different liquid crystal molecule deflection directions in one pixel unit. In this way, the array substrate provided by the embodiment of the invention may achieve multi-domain display for the liquid crystal display panel.

Since there is a low requirement on the dimension precision of the insulating layer unit in a display device, and the insulating layer unit has a larger size than the electrode strip, a multi-domain liquid crystal display device may be implemented by simply changing the structure of the insulating layer unit, thereby reducing the process cost for manufacturing the array substrate.

Figure 3:
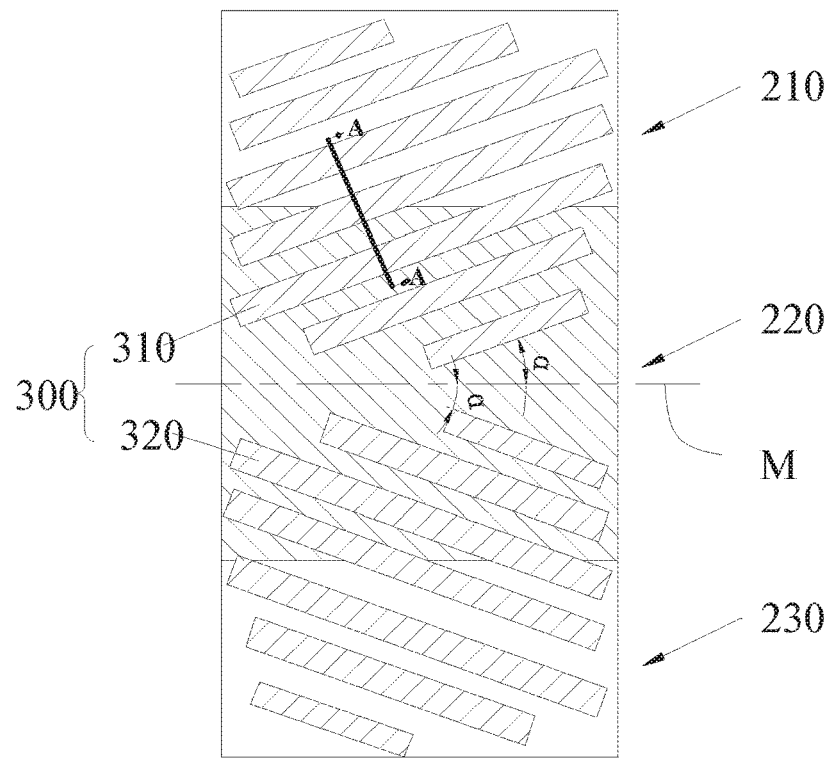
FIG. 3 is a top view of an array substrate provided by an embodiment of the invention.

As an example implementation, as shown in FIG. 3, within each of the pixel units, the insulating layer unit comprises a first insulating region 210, a second insulating region 220 and a third insulating region 230. The first insulating region 210 and the third insulating region 230 have the same dielectric constant, and the second insulating region 220 has a dielectric constant different from the dielectric constant of the first insulating region 210. The second insulating region 220 is located between the first insulating region 210 and the third insulating region 230. It is easy to understand that, since the dielectric constant of the second insulating region 220 is different from that of the first insulating region 210, the dielectric constant of the second insulating region 220 is also different from that of the third insulating region 230.

In the embodiment shown in FIG. 3, at least three-domain liquid crystal display may be achieved. For the liquid crystal display device, as the domains increase, the color cast of the liquid crystal display device may be improved more effectively.

As an embodiment of the invention, the area of the second insulating region 220 is half the area of the pixel unit, and the area of the first insulating region 210 is equal to that of the third insulating region 230.

In various embodiments, a plurality of insulating regions having different dielectric constants may be achieved within one pixel unit in different ways.

As an embodiment of the invention shown in FIG. 1, within each of the pixel units, the first insulating region 210 comprises a first bottom insulating layer 210a and a first top insulating layer 210b, and the third insulating region comprises a third bottom insulating layer and a third top insulating layer (not shown in FIG. 1). The first bottom insulating layer 210a, the second insulating region 220 and the third bottom insulating layer may be formed as one-piece. The dielectric constant of the first top insulating layer 210b may be the same as that of the third top insulating layer. The top surface of the first top insulating layer 210b, the top surface of the third top insulating layer and the top surface of the second insulating region 220 are flush with one another.

A method for implementing this embodiment will be described in detail below, which is not repeated here for simplicity.

In some embodiments, the first bottom insulating layer 210a, the second insulating region 220 and the third bottom insulating layer may be made of a nitride of silicon (SiNx), and the first top insulating layer 210b and the third top insulating layer may be made of a transparent resin. The nitride of silicon may be formed by means of chemical vapor deposition process, and the transparent resin may be formed by means of coating process. In this way, insulating layer unit of this embodiment may reduce the process cost.

Figure 2:
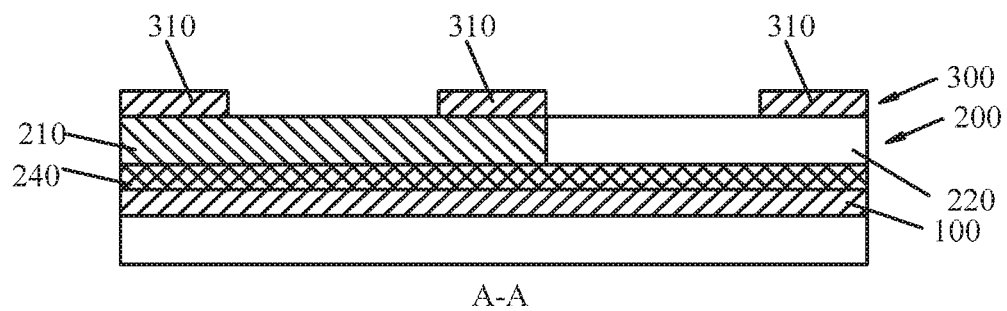
FIG. 2 is a sectional schematic view of an array substrate provided by another embodiment of the invention.

As another embodiment of the invention shown in FIG. 2, the material of the first insulating region 210 is identical with the material of the third insulating region (not shown in FIG. 2), and the material of the first insulating region 210 is different from the material of the second insulating region 220.

In this embodiment, the first insulating region 210 is made of one and the same material, and the third insulating region is made of one and the same material, and the second insulating region 220 is made of one and the same material.

In some embodiments, the first insulating region may be made of an oxide of silicon (SiOx), and the second insulating region may be made of a nitride of silicon (SiNx).

To achieve multi-domain liquid crystal display, in another embodiment, as shown in FIG. 3, in each of the pixel units, the second electrode comprises a second left electrode and a second right electrode. The second left electrode comprises a plurality of mutually parallel second left electrode strips 310, the second right electrode comprises a plurality of mutually parallel second right electrode strips 320, and the second left electrode strips 310 and the second right electrode strips 320 have different inclined directions.

Since the second left electrode strips 310 and the second right electrode strips 320 have different inclined directions, the electric field between the second left electrode and the first electrode is different from the electric field between the second right electrode and the first electrode. Furthermore, due to different dielectric constants of the insulating regions, multi-domain display may be achieved.

To facilitate the manufacture and design and enable the electric field generated in the pixel unit to be more homogeneous, in some embodiments, the second left electrode and the second right electrode are mirror symmetrical with respect to a central line M of the pixel unit. As shown in FIG. 3, the central line M divides the pixel unit into two portions in the lengthwise direction. The angle between the second left electrode strip 310 and the central line M is α, and the angle between the second right electrode strip 320 and the central line M is also α. In some embodiments, $7° \leq \alpha 11°$.

As shown in FIG. 3, a part of the second left electrode is located within the first insulating region 210, while the other part of the second left electrode is located within the second insulating region 220. A part of the second right electrode is located within the second insulating region 220, while the other part of the second right electrode is located within the third insulating region 230. Therefore, the embodiment shown in FIG. 3 may achieve four-domain liquid crystal display.

FIGS. 1 and 2 may represent sectional views of the pixel unit shown in FIG. 3 along the line A-A.

Those skilled in the art may understand that the array substrate may further comprise other insulating layers, for example, a gate insulating layer for a switching element (TFT) in the array substrate. In some embodiments, as shown in FIG. 1 or 2, the array substrate may further comprise a gate insulating layer 240 between the first electrode layer 100 and the insulating layer 200. FIG. 1 or 2 just illustrates the gate insulating layer 240, other layer structures associated with the switching element are known to those skilled in the art, which are not shown here for clarity. Furthermore, a base substrate such as glass substrate may be arranged below the first electrode, which is known to those skilled in the art and will not be discussed here in detail.

Figure 4:
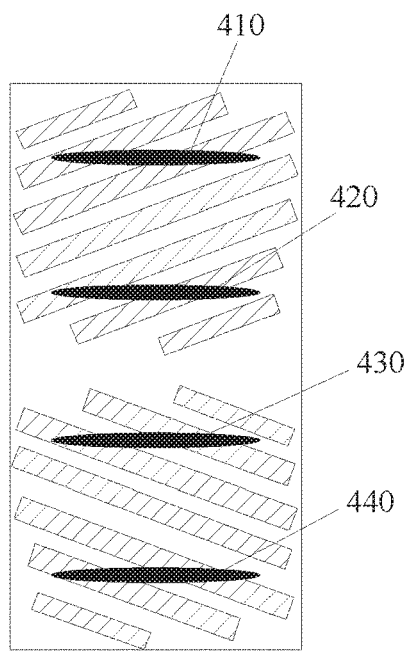
FIG. 4 illustrates the states of liquid crystal molecules when the display panel provided by an embodiment of the invention is in the off state.

As shown in FIG. 4, when the display panel is in an off state, none of the liquid crystal molecules is deflected.

Figure 5:
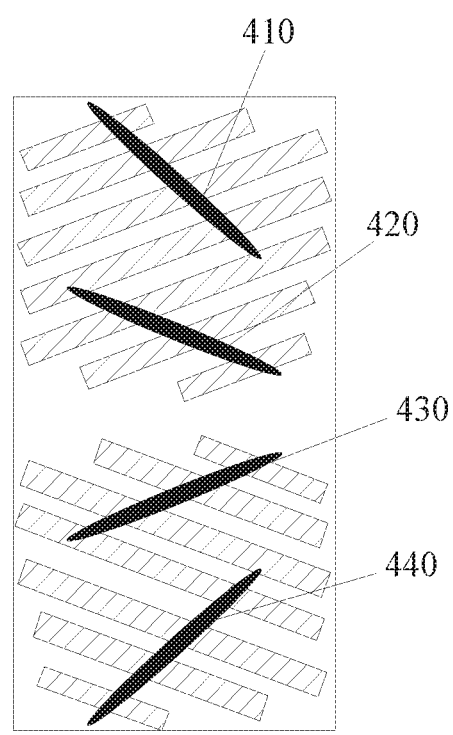
FIG. 5 illustrates the states of liquid crystal molecules when the display panel provided by an embodiment of the invention in the on state.

As shown in FIG. 5, when the display panel is powered on, four electric fields with different intensities may be formed in one pixel unit. The electric field generated between the part of the second left electrode that is located within the first insulating region and the first electrode is E1, the electric field generated between the part of the second left electrode that is located within the second insulating region and the first electrode is E2, the electric field generated between the part of the second right electrode that is located within the second insulating region and the first electrode is E3, and the electric field generated between the part of the second right electrode that is located in the third insulating region and the first electrode is E4. Consequently, the deflection direction of a group of liquid crystal molecules 410 to which the electric field E1 corresponds, the deflection direction of a group of liquid crystal molecules 420 to which the electric field E2 corresponds, the deflection direction of a group of liquid crystal molecules 430 to which the electric field E3 corresponds, and the deflection direction of a group of liquid crystal molecules 440 to which the electric field E4 corresponds are mutually different. That is, when the display panel is in an on state, the liquid crystal molecules in a pixel unit may have four deflection directions, i.e. four-domain display may be achieved.

In some embodiments, the first electrode 100 may be a block electrode.

In some embodiments of the invention, the first electrode may be a common electrode, and the second electrode may be a pixel electrode.

As another aspect of the invention, there is provided a display panel. The display panel comprises an array substrate, which may be the array substrate provided in any of the above embodiments of the invention.

Since the manufacture process for the above array substrate is simple and of low cost, a display panel with a characteristic of multi-domain display may be obtained using simple manufacture process.

As a further aspect of the invention, there is provided a display device. The display device comprises a display panel provided by the embodiment of the invention.

The display device may be display devices such as a mobile phone, a computer, a television, and so on.

As yet another aspect of the invention, there is provided a method for manufacturing an array substrate. The array substrate may be divided into a plurality of pixel units, the manufacturing method comprises:

forming a first electrode layer, the first electrode layer comprising a first electrode arranged in each of the pixel units;

forming an insulating layer, the insulating layer covering the first electrode layer, and the insulating layer comprising an insulating layer unit covering the surface of each first electrode, within each of the pixel units, the insulating layer unit comprising a plurality of insulating regions, at least one of the insulating regions having a dielectric constant different from dielectric constants of other insulating regions;

forming a second electrode layer, the second electrode layer comprising a second electrode arranged on the insulating layer unit.

Compared with the solution of forming electrode strips having multiple different inclined directions, the process of forming an insulating layer unit having a plurality of insulating regions is much simpler.

As stated above, within each of the pixel units, the insulating layer unit comprises a first insulating region, a second insulating region and a third insulating region. The first insulating region and the third insulating region have the same dielectric constant, the second insulating region has a dielectric constant different from the dielectric constant of the first insulating region, and the second insulating region is located between the first insulating region and the third insulating region.

In an embodiment of the invention, the area of the second insulating region is half the area of the pixel unit, and the area of the first insulating region is equal to that of the third insulating region.

For the embodiment shown in FIG. 1, the step of forming the insulating layer may comprise:

forming a bottom insulating material layer, within each of the pixel units, the bottom insulating material layer comprising a first bottom insulating layer, the second insulating region and a third bottom insulating layer;

forming a top insulating material layer, the top insulating material layer comprising a top insulating material unit within each of the pixel units, the top insulating material unit comprising a first top insulating material layer arranged on the first bottom insulating layer and a third top insulating material layer arranged on the third bottom insulating layer, the dielectric constant of the first top insulating material layer being the same as that of the third top insulating material layer, the top surface of the first top insulating material layer, the top surface of the third top insulating material layer and the top surface of the second insulating region being flush with one another.

In some embodiments of the invention, the bottom insulating material layer may be formed by dry etching process. Specifically, a layer of bottom insulating material is firstly formed, a mask layer is formed on the bottom insulating material, and through holes are formed respectively at the positions on the mask layer which correspond to the first bottom insulating layer and the third bottom insulating layer, then process gas is supplied, and the first bottom insulating layer, the second insulating region and the third bottom insulating layer may be formed by controlling the duration of supplying process gas.

In some embodiments, the bottom insulating material layer is made of a nitride of silicon, and the top insulating material layer is made of a transparent resin.

As regards the embodiment shown in FIG. 2, the step of forming the insulating layer comprises:

forming a first insulating material layer;

forming a first through hole at a position on the first insulating material layer corresponding to the first insulating region, and forming a third through hole at a position on the first insulating material layer corresponding to the third insulating region, thereby forming a second insulating region using the first insulating material layer; forming the first insulating region in the first through hole, and forming the third insulating region in the third through hole. For example, the first through hole and the third through hole may be filled respectively with different insulating materials to form the first insulating region and the third insulating region. The first through hole and the third through hole may also be formed by means of dry etching process, which is similar to the process stated above for forming the first bottom insulating layer, the second insulating region and the third bottom insulating layer, which is not repeated for simplicity.

In embodiments, the first insulating region is made of an oxide of silicon, and the second insulating region is made of a nitride of silicon.

In some embodiments, within each of the pixel units, the second electrode comprises a second left electrode and a second right electrode. The second left electrode comprises a plurality of mutually parallel second left electrode strips, the second right electrode comprises a plurality of mutually parallel second right electrode strips, and the second left electrode strips and the second right electrode strips have different inclined directions.

As stated above, the manufacturing method may further comprises forming a gate insulating layer located between the first electrode layer and the insulating layer.

In some embodiments, the second left electrode and the second right electrode are mirror symmetrical with respect to a central line of the pixel unit. The central line may divide the pixel unit into two portions along the lengthwise direction, and the angle between the second left electrode strip and the central line is 7° to 11°. It is easy to understand that the angle between the second left electrode strip and the central line is equal to the angle between the second right electrode strip and the central line, since the second left electrode and the second right electrode are mirror symmetrical with respect to the central line of the pixel unit.

In some embodiments, the first electrode is a block electrode.

In the embodiments of the invention, the first electrode and the second electrode may be formed by means of traditional patterning process.

It may be appreciated that the above embodiments are just exemplary examples used for illustrating the principle of the invention, and that the present invention is not so limited. Various variations and improvements may be made by those ordinarily skilled in the art without departing from the spirit and essence of the invention. These variations and improvements are regarded as falling within the scope of the invention.

The invention claimed is:

1. An array substrate, the array substrate comprising a plurality of pixel units, the array substrate comprising a first electrode layer, an insulating layer covering the first electrode layer and a second electrode layer formed on the insulating layer, the first electrode layer comprising a first electrode arranged in each of the pixel units, the insulating layer comprising an insulating layer unit covering a surface of each of the first electrodes, the second electrode layer comprising a second electrode arranged on the insulating layer unit, wherein within each of the pixel units, the insulating layer unit comprises a plurality of insulating regions, at least one of the insulating regions having a dielectric constant different from dielectric constants of other insulating regions, wherein within each of the pixel units, the insulating layer unit comprises a first insulating region, a second insulating region and a third insulating region, the first insulating region and the third insulating region have the same dielectric constant, the second insulating region has a dielectric constant different from that of the first insulating region, the second insulating region is located between the first insulating region and the third insulating region, and wherein the first insulating region comprises a first bottom insulating layer and a first top insulating layer, the third insulating region comprises a third bottom insulating layer and a third top insulating layer, wherein the first bottom insulating layer, the second insulating region and the third bottom insulating layer are formed as one-piece.

2. The array substrate according to claim 1, wherein an area of the second insulating region is half an area of the pixel unit, an area of the first insulating region is equal to that of the third insulating region.

3. The array substrate according to claim 1, wherein an dielectric constant of the first top insulating layer is the same as that of the third top insulating layer, and wherein a top surface of the first top insulating layer, a top surface of the third top insulating layer and a top surface of the second insulating region are flush with one another.

4. The array substrate according to claim 3, wherein the first bottom insulating layer, the second insulating region and the third bottom insulating layer are made of a nitride of silicon, the first top insulating layer and the third top insulating layer are made of a transparent resin.

5. The array substrate according to claim 1, wherein the array substrate further comprises a gate insulating layer arranged between the first electrode layer and the insulating layer.

6. The array substrate according to claim 1, wherein the first electrode is a block electrode.

7. The array substrate according to claim 1, wherein in each of the pixel units, the second electrode comprises a second left electrode and a second right electrode, the second left electrode comprises a plurality of mutually parallel second left electrode strips, the second right electrode comprises a plurality of mutually parallel second right electrode strips, the second left electrode strip and the second right electrode strip have different inclined directions.

8. The array substrate according to claim 7, wherein the second left electrode and the second right electrode are mirror symmetrical with respect to a central line of the pixel unit, the central line dividing the pixel unit into two portions along a length direction,
wherein an angle between the second left electrode strip and the central line is 7° to 11°.

9. A display device comprising a display panel, the display panel comprising an array substrate, the array substrate comprising a plurality of pixel units, the array substrate comprising a first electrode layer, an insulating layer covering the first electrode layer and a second electrode layer formed on the insulating layer, the first electrode layer comprising a first electrode arranged in each of the pixel units, the insulating layer comprising an insulating layer unit covering a surface of each of the first electrodes, the second electrode layer comprising a second electrode arranged on the insulating layer unit,
wherein within each of the pixel units, the insulating layer unit comprises a plurality of insulating regions, at least one of the insulating regions having a dielectric constant different from dielectric constants of other insulating regions,
wherein within each of the pixel units, the insulating layer unit comprises a first insulating region, a second insulating region and a third insulating region, the first insulating region and the third insulating region have the same dielectric constant, the second insulating region has a dielectric constant different from that of the first insulating region, the second insulating region is located between the first insulating region and the third insulating region, and
wherein the first insulating region comprises a first bottom insulating layer and a first top insulating layer, the third insulating region comprises a third bottom insulating layer and a third top insulating layer, wherein the first bottom insulating layer, the second insulating region and the third bottom insulating layer are formed as one-piece.

10. A manufacturing method for an array substrate, the array substrate comprising a plurality of pixel units, wherein the manufacturing method comprises:
forming a first electrode layer, the first electrode layer comprising a first electrode arranged in each of the pixel units;
forming an insulating layer, the insulating layer covering the first electrode layer, and the insulating layer comprising an insulating layer unit covering a surface of each of the first electrodes, within each of the pixel units, the insulating layer unit comprising a plurality of insulating regions, at least one of the insulating regions having a dielectric constant different from dielectric constants of other insulating regions;
forming a second electrode layer, the second electrode layer comprising a second electrode arranged on the insulating layer unit,
wherein within each of the pixel units, the insulating layer unit comprises a first insulating region, a second insulating region and a third insulating region, the first insulating region and the third insulating region have the same dielectric constant, the second insulating region has a dielectric constant different from the dielectric constant of the first insulating region, the second insulating region is located between the first insulating region and the third insulating region,
wherein the step of forming an insulating layer comprises:
forming a bottom insulating material layer, within each of the pixel units, the bottom insulating material layer comprising a first bottom insulating layer, the second insulating region and a third bottom insulating layer;
forming a top insulating material layer, the top insulating material layer comprising a top insulating material unit arranged within each of the pixel units, the top insulating material unit comprising a first top insulating material layer arranged on the first bottom insulating layer and a third top insulating material layer arranged on the third bottom insulating layer, a dielectric constant of the first top insulating material layer being the same as that of the third top insulating material layer, a top surface of the first top insulating material layer, a top surface of the third top insulating material layer and a top surface of the second insulating region being flush with one another.

11. The manufacturing method according to claim 10, wherein an area of the second insulating region is half an area of the pixel unit, an area of the first insulating region is equal to that of the third insulating region.

12. The manufacturing method according to claim 10, wherein the bottom insulating material layer is made of a nitride of silicon, the top insulating material layer is made of a transparent resin.

13. The manufacturing method according to claim 10, wherein in each of the pixel units, the second electrode comprises a second left electrode and a second right electrode, the second left electrode comprises a plurality of mutually parallel second left electrode strips, the second right electrode comprises a plurality of mutually parallel second right electrode strips, the second left electrode strip and the second right electrode strip have different inclined directions.

14. The manufacturing method according to claim 13, wherein the second left electrode and the second right electrode are mirror symmetrical with respect to a central line of the pixel unit, the central line dividing the pixel unit into two portions along a length direction, wherein an angle between the second left electrode strip and the central line is 7° to 11°.

* * * * *